(12) United States Patent
Song et al.

(10) Patent No.: US 9,997,739 B2
(45) Date of Patent: Jun. 12, 2018

(54) WHITE ORGANIC LIGHT EMITTING DEVICE (71) Applicant: LG Display Co., Ltd., Seoul (KR)

(72) Inventors: Ki-Woog Song, Jeonbuk (KR); Sung-Hoon Pieh, Seoul (KR); Sung-Jae Ko, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 13/623,452

(22) Filed: Sep. 20, 2012

(65) Prior Publication Data
US 2013/0069077 A1    Mar. 21, 2013

(30) Foreign Application Priority Data

Sep. 20, 2011  (KR) .................. 10-2011-0094917
Aug. 8, 2012   (KR) .................. 10-2012-0086566

(51) Int. Cl.
*H01L 33/26* (2010.01)
*H01L 51/52* (2006.01)
(Continued)

(52) U.S. Cl.
CPC ...... *H01L 51/5278* (2013.01); *H01L 27/3209* (2013.01); *H01L 51/5004* (2013.01);
(Continued)

(58) Field of Classification Search
CPC ........... H01L 21/02458; H01L 21/0254; H01L 33/007; H01L 29/2003; H01L 33/32;
(Continued)

(56) References Cited

U.S. PATENT DOCUMENTS

2006/0134460 A1* 6/2006 Kondakova ............ C09K 11/06
428/690
2007/0126350 A1* 6/2007 Lee et al. .................. 313/506
(Continued)

FOREIGN PATENT DOCUMENTS

CN   101752509 A   6/2010
CN   102034934 A   4/2011
(Continued)

OTHER PUBLICATIONS

Office Action dated Apr. 29, 2014 from the Korean Patent Office in counterpart Korean application No. 10-2012-0086566.
(Continued)

*Primary Examiner* — Allen Parker
*Assistant Examiner* — Long H Le
(74) *Attorney, Agent, or Firm* — Morgan, Lewis & Bockius LLP (57) ABSTRACT Disclosed white organic light emitting device includes an anode and a cathode opposing each other; a charge generation layer interposed between the anode and the cathode; a first stack interposed between the anode and the charge generation layer, the first stack including a first hole transport layer and a first light emitting layer emitting blue fluorescent light; and a second stack interposed between the charge generation layer and the cathode, the second stack including a second hole transport layer and a second light emitting layer formed by doping one host with at least one of phosphorescent dopant, wherein a triplet energy level of the first hole transport layer is higher than a triplet energy level of the first light emitting layer, and a hole mobility of the first hole transport layer is $5.0 \times 10^{-4}$ cm$^2$/s·V to $9.9 \times 10^{-3}$ cm$^2$/s·V.

16 Claims, 5 Drawing Sheets

(51) Int. Cl.
 *H01L 27/32* (2006.01)
 *H01L 51/50* (2006.01)
(52) U.S. Cl.
 CPC ...... *H01L 51/5016* (2013.01); *H01L 51/5096* (2013.01); *H01L 2251/5376* (2013.01); *H01L 2251/55* (2013.01)
(58) Field of Classification Search
 CPC ............. H01L 27/3209; H01L 51/5016; H01L 51/5096; H01L 51/5048; H01L 51/5278; H01L 51/5004
 USPC ........................................ 257/40, 76; 31/504
 See application file for complete search history.

(56) References Cited

U.S. PATENT DOCUMENTS

| | | | | |
|---|---|---|---|---|
| 2007/0241667 | A1* | 10/2007 | Ohsawa et al. ............... | 313/504 |
| 2007/0252516 | A1* | 11/2007 | Kondakova ......... | H01L 51/5016 |
| | | | | 313/504 |
| 2008/0007170 | A1* | 1/2008 | Kim ................... | H01L 51/5012 |
| | | | | 313/506 |
| 2008/0191621 | A1* | 8/2008 | Ha ..................... | H01L 51/5008 |
| | | | | 313/506 |
| 2008/0297036 | A1* | 12/2008 | Noh et al. ..................... | 313/504 |
| 2008/0315753 | A1* | 12/2008 | Liao ....................... | C09K 11/06 |
| | | | | 313/504 |
| 2009/0309487 | A1* | 12/2009 | Royster, Jr. ......... | H01L 51/0082 |
| | | | | 313/504 |
| 2010/0044689 | A1* | 2/2010 | Nishimura ............. | C09K 11/06 |
| | | | | 257/40 |
| 2010/0084647 | A1* | 4/2010 | Kondakova et al. ........... | 257/40 |
| 2010/0123150 | A1* | 5/2010 | Anandan ............. | H01L 27/3209 |
| | | | | 257/98 |
| 2010/0133522 | A1* | 6/2010 | Pieh et al. ...................... | 257/40 |
| 2010/0176380 | A1* | 7/2010 | Jung .................... | C07D 213/30 |
| | | | | 257/40 |
| 2011/0073844 | A1* | 3/2011 | Pieh .................... | H01L 51/5036 |
| | | | | 257/40 |
| 2011/0121320 | A1* | 5/2011 | Pieh .................... | H01L 51/5036 |
| | | | | 257/79 |
| 2011/0215309 | A1* | 9/2011 | D'Andrade ......... | H01L 51/5016 |
| | | | | 257/40 |
| 2012/0098012 | A1* | 4/2012 | Kim .................... | H01L 27/3209 |
| | | | | 257/98 |

FOREIGN PATENT DOCUMENTS

| | | |
|---|---|---|
| KR | 20110063818 A | 6/2011 |
| KR | 1020110035048 A | 6/2011 |
| WO | 2010/028262 A1 | 3/2010 |

OTHER PUBLICATIONS

Office Action dated Nov. 21, 2014 from The State Intellectual Property Office of the People's Republic of China in a counterpart Chinese application No. 201210350388.9.

* cited by examiner

Increase in triplet energy of HTL

WHITE ORGANIC LIGHT EMITTING DEVICE

This application claims the benefit of Korean Patent Application No. P 10-2011-0094917, filed on Sep. 20, 2011 and Korean Patent Application No. P 10-2012-0086566, filed on Aug. 8, 2012, both of which are hereby incorporated by reference as if fully set forth herein.

BACKGROUND OF THE INVENTION

Field of the Invention

The present invention relates to an organic light emitting device. More specifically, the present invention relates to a white organic light emitting device in which the efficiency of a blue fluorescent stack is improved to be similar to that of a phosphorescent stack.

Discussion of the Related Art

The recent trend toward information-dependent age has brought about rapid development in display fields in which electrical information signals are visually displayed. In this regard, a variety of flat display devices having superior properties such as slimness, low weight and low power consumption have been developed and are actively used as substitutes for conventional cathode ray tubes (CRTs).

Specific examples of flat display devices include liquid crystal display devices (LCDs), plasma display panel devices (PDPs), field emission display devices (FEDs), organic light emitting devices (OLEDs) and the like.

Among these, organic light emitting devices that do not require an additional light source, realize a compact design and render clear color are considered to be competitive applications.

Such organic light emitting devices require formation of organic light emitting layers.

An organic light emitting device in which a stack structure including organic light emitting layers having different colors is laminated without patterning the organic light emitting layers at respective pixels in order to render white light was suggested.

That is, in white organic light emitting devices, light emitting diodes are formed by depositing layers between an anode and a cathode without using a mask, and organic films including organic light emitting layers are sequentially deposited under vacuum using different materials.

White organic light emitting devices are utilized in various applications including thin light sources, backlights of liquid crystal display, or full-color displays using color filters.

Meanwhile, each stack of conventional white organic light emitting devices includes a hole transport layer, a light emitting layer and an electron transport layer.

In this regard, when a white organic light emitting device having a laminate structure including a fluorescent stack and a phosphorescent stack is formed, the fluorescent stack exhibits a relatively low efficiency. As a result, great difference in color upon operation at low current occurs.

These conventional white organic light emitting devices have the following problems.

When the white organic light emitting device having a laminate structure including a fluorescent stack and a phosphorescent stack is formed, the fluorescent stack exhibits relatively low efficiency. In particular, color of fluorescence emitted from the fluorescent stack during operation at a low current has a considerably low intensity, while the color of phosphorescence emitted from the phosphorescent stack has an intensity of a predetermined level or more. That is, the difference in color therebetween is great.

The reason is as follows.

That is, triplet excitons of the light emitting layer are diffused from the fluorescent stack into the hole transport layer of the fluorescent stack due to low triplet energy level. The reason for this is that diffusion distance of excitons from the fluorescent stack is longer than the thickness of a commonly used blocking layer. Such exciton diffusion occurring at a low current at which sufficient excitons are not formed greatly deteriorates efficiency of a blue fluorescent stack and decreases efficiency.

For this reason, a screen displayed by a display device to which the white organic light emitting device is applied renders warm white in color that appears redder or yellower than a normal state. At this time, a viewer recognizes deterioration in image quality.

SUMMARY OF THE INVENTION

Accordingly, the present invention is directed to a white organic light emitting device that substantially obviates one or more problems due to limitations and disadvantages of the related art.

It is one object of the present invention to provide a white organic light emitting device in which the efficiency of a blue fluorescent stack is improved to be similar to that of a phosphorescent stack.

In accordance with one aspect of the present invention, provided is a white organic light emitting device including: an anode and a cathode opposing each other on a substrate; a charge generation layer interposed between the anode and the cathode; a first stack interposed between the anode and the charge generation layer, the first stack including a first hole transport layer, a first light emitting layer emitting blue fluorescent light and a first electron transport layer; and a second stack interposed between the charge generation layer and the cathode, the second stack including a second hole transport layer, a second light emitting layer formed by doping one host with at least one of phosphorescent dopant, and a second electron transport layer, wherein a triplet energy level of the first hole transport layer is higher than a triplet energy level of the first light emitting layer, and a hole mobility of the first hole transport layer is $5.0 \times 10^{-4}$ cm$^2$/s·V to $9.9 \times 10^{-3}$ cm$^2$/s·V.

The triplet energy level of the first hole transport layer may be 2.4 eV or more.

The first hole transport layer may further include a first blocking layer adjacent to the first light emitting layer, to prevent introduction of electrons or excitons into the first light emitting layer. In this case, the first blocking layer may have a triplet energy level that is 0.01 eV to 0.4 eV higher than the triplet energy level of the first light emitting layer.

Also, the white organic light emitting device may further include a second blocking layer interposed between the second hole transport layer and the second light emitting layer, wherein the second blocking layer has a higher triplet energy level than the triplet energy level of the second light emitting layer. In this case, the second blocking layer may have a triplet energy level that is 0.01 eV to 0.4 eV higher than the triplet energy level of the second light emitting layer.

The phosphorescent dopant of the second light emitting layer may contain a yellow phosphorescent dopant and a green phosphorescent dopant, or a red phosphorescent dopant and a green phosphorescent dopant, as a combination of a first phosphorescent dopant and a second phosphorescent dopant. Alternatively, the phosphorescent dopant of the second light emitting layer may contain a yellowish green phosphorescent dopant.

In accordance with another aspect of the present invention, provided is a white organic light emitting device comprising: an anode and a cathode that face each other on a substrate; a charge generation layer interposed between the anode and the cathode; and a first stack and a second stack interposed between the anode and the charge generation layer, and between the charge generation layer and the cathode, respectively, wherein each stack comprises a hole transport layer, a blocking layer, a light emitting layer and an electron transport layer laminated in this order, the light emitting layer of the first stack is a blue fluorescent layer and the light emitting layer of the second stack is a phosphorescent layer formed by doping a phosphorescent dopant, a triplet energy level of each blocking layer of the first and second stacks is higher than a triplet energy level of the light emitting layer adjacent thereto, and a hole mobility of the hole transport layer of the first stack is $5.0 \times 10^{-4}$ cm$^2$/s·V to $9.9 \times 10^{-3}$ cm$^2$/s·V.

The triplet energy level of the hole transport layer of the first stack may be higher than the triplet energy level of the light emitting layer of the first stack and is 2.4 eV or more.

The blocking layer of the first stack may have a triplet energy level that is 0.01 eV to 0.4 eV higher than a triplet energy level of the blue fluorescent layer.

The blocking layer of the second stack may have a triplet energy level that is 0.01 eV to 0.4 eV higher than a triplet energy level of the phosphorescent layer.

The phosphorescent dopant may contain a yellow phosphorescent dopant and a green phosphorescent dopant, or a red phosphorescent dopant and a green phosphorescent dopant. Alternatively, the phosphorescent dopant may contain a yellowish green phosphorescent dopant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

Hereinafter, a white organic light emitting device according to the present invention will be described in detail with reference to the accompanying drawings.

Figure 1:
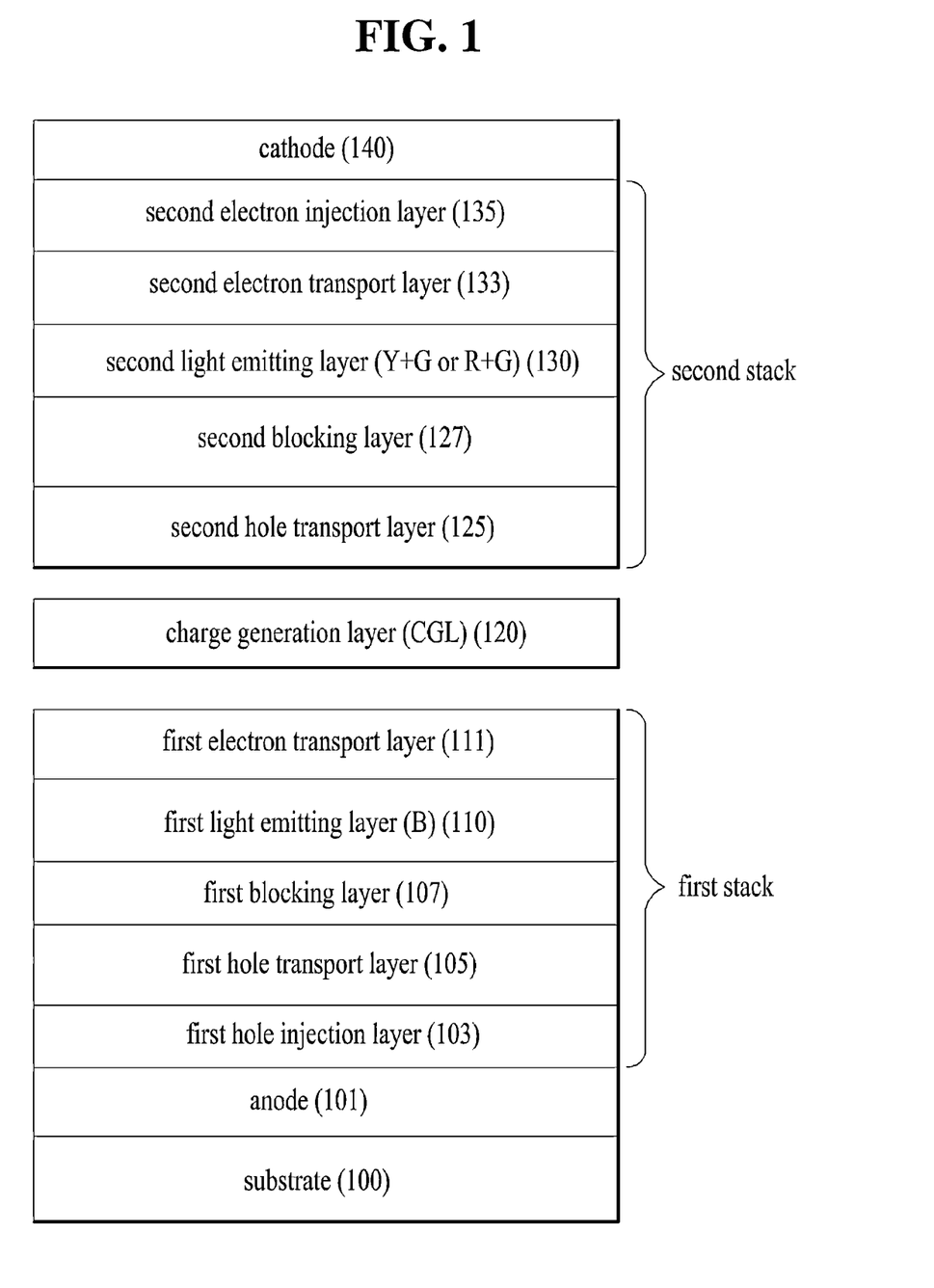
FIG. 1 is a sectional view illustrating a white organic light emitting device according to the present invention.

FIG. 1 is a sectional view illustrating a white organic light emitting device according to the present invention.

As shown in FIG. 1, the white organic light emitting device according to the present invention includes a substrate 100, an anode 101 and a cathode 140 that face each other on the substrate 100, a first stack laminated between the anode 101 and the cathode 140, a charge generation layer 120 and a second stack.

The anode 101 is formed of a transparent electrode material such as indium tin oxide (ITO) and the cathode 140 is formed of a reflective metal such as aluminum (Al). According to the light emission effects occurring in the first and second stacks and based on this configuration, an image is displayed in a lower part based on the illustrated drawing.

The first stack includes a hole injection layer (HIL) 103, a hole transport layer (HTL) 105, a first electron (or exciton) blocking layer (EBL) 107, a first light emitting layer 110 and a first electron transport layer (ETL) 111 which are laminated between the anode 101 and the charge generation layer 120 in this order, and the second stack includes a second hole transport layer 125, a second electron (or exciton) blocking layer (EBL) 127, a second light emitting layer 130, a second electron transport layer 133 and a second electron injection layer (EIL) 135 between the charge generation layer 120 and the cathode 140.

A first electron injection layer (EIL) and a second hole injection layer (HIL) may be further disposed under and on the charge generation layer 120, respectively.

In some cases, the hole injection layer or electron injection layer of each stack is omitted and it may form a single layer, together with the hole transport layer or electron transport layer.

The first light emitting layer 110 is a light emitting layer that contains a blue fluorescent or phosphorescent dopant in one blue light host, and the second light emitting layer 130 is a single light emitting layer in which yellow and green phosphorescent dopants, or red and green phosphorescent dopants are doped as a combination of a first phosphorescent dopant and a second phosphorescent dopant. Alternatively, the phosphorescent dopant of the second light emitting layer may contain only a yellowish green phosphorescent dopant.

In this case, during driving of the white organic light emitting device, white light may be realized by mixing blue fluorescence of the first light emitting layer 110 with phosphorescence emitted from the second light emitting layer 130. The color of light emitted from the second light emitting layer 130 may be a combination with other color dopant that is mixed with blue light of the first light emitting layer 110 to render white, in addition to a combination of yellow and green phosphorescent dopants (Y+G), a combination of red and green phosphorescent dopants (R+G), or a yellowish green dopant (YG) to render white.

Also, the charge generation layer 120 interposed between the first stack and the second stack controls charge balance between respective stacks. The charge generation layer 120 has low optical and electrical loss and metals, oxides, semiconductors, organic substances and laminates thereof are known as materials used for the charge generation layer 120.

Here, the first blocking layer 107 and the second blocking layer 127 are set to have a triplet energy level higher than an energy level of an excited state of triplet excitons of the first light emitting layer 110 and the second light emitting layer 130 (hereinafter, triplet energy level).

In this case, both the first blocking layer 107 and the second blocking layer 127 may be set to have a triplet energy level higher than the triplet energy level of respective adjacent light emitting layers. In this case, energy levels of the first blocking layer 107 or/and the second blocking layer 127 are set to be higher than an energy level of an excited state of triplet excitons of the first light emitting layer 110 and the second light emitting layer 130 to prevent electron excitons from being diffused into the first blocking layer 107 and the second blocking layer 127. In this case, the triplet energy levels of the first blocking layer 107 or/and the second blocking layer 127 may be set to be 0.01 eV to 0.4 eV higher than those of the first light emitting layer 110 and the second light emitting layer 130. As shown in the drawing, when the blocking layer is provided between the hole transport layer and the light emitting layer such that it is adjacent to the light emitting layer, the triplet energy level of the blocking layer may be higher than 0.4 eV.

Accordingly, it is possible to prevent deterioration in luminous efficacy caused by introduction of triplet excitons or electrons of the second light emitting layer 130 and the first light emitting layer 110 into the adjacent second blocking layer 127 and first blocking layer 107.

In some cases, the first blocking layer 107 and the second blocking layer 127 are omitted and the hole transport layer may be set to have a higher triplet energy level than that of the light emitting layer so that the hole transport layer serves as a blocking layer.

In this case, the increased triplet energy level of the hole transport layer may be set to be 0.01 to 0.4 eV higher than the energy level of an excited state of triplet excitons of the first light emitting layer 110 or the second light emitting layer 130. The difference in triplet energy level between hole transport layers adjacent to the blocking layer prevents diffusion of excitons from the light emitting layer to the hole transport layer.

Here, triplet energy levels of the first hole transport layer 105 and/or the second hole transport layer 125 may be 2.4 eV or more, and the first blocking layer 107 and the second blocking layer 127 have an energy level similar to or slightly higher than 2.4 eV.

The second hole transport layer 125 and the first hole transport layer 105 inherently function to transport holes from the second light emitting layer 130 and the first light emitting layer 110 and serve as exciton blocking layers to block introduction of triplet excitons or electrons. In this case, the hole transport layer that serves as a blocking layer contains a substance capable of blocking excitons.

Meanwhile, in the white organic light emitting device of the present invention, the first hole transport layer 105 that fluoresces in the first stack has a hole mobility of $5.0 \times 10^{-4}$ $cm^2/s \cdot V$ to $9.9 \times 10^{-3}$ $cm^2/s \cdot V$, and thus exhibits a higher hole (H) movement speed even under low current conditions, thereby reducing difference in color between light emitted from the first stack and the second stack. In some cases, more preferably, when the first hole transport layer 105 has a higher hole movement speed within the hole mobility range of $6.0 \times 10^{-4}$ $cm^2/s \cdot V$ to $5.0 \times 10^{-3}$ $cm^2/s \cdot V$, blue light emission efficiency in a blue fluorescent stack can be further improved.

The mechanism of the white organic light emitting device of the present invention will be described with reference to the following drawings.

Figure 2:
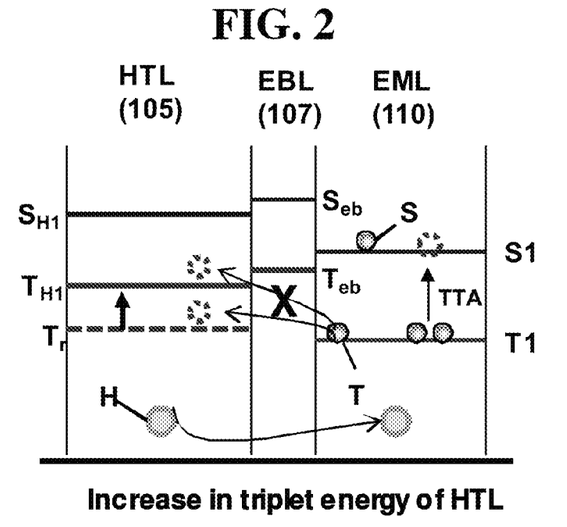
FIG. 2 is a view illustrating energy levels of layers adjacent to the light emitting layer in the white organic light emitting device of the present invention.

FIG. 2 is a view illustrating energy levels of layers adjacent to the light emitting layer in the white organic light emitting device of the present invention.

As shown in FIG. 2, the triplet energy level (Teb) of the first blocking layer 107 adjacent to the first light emitting layer (EML) 110 is set to be higher than the triplet energy level (T1) of the first light emitting layer 110 to prevent triplet excitons (T) from being introduced into the first hole transport layer 105. Such a function of the first blocking layer 107 may be imparted to the second blocking layer 127 via the same design. Alternatively, each stack is provided with a blocking layer, and it is possible to more effectively make the difference between a triplet energy level (Teb) of the first blocking layer 107 adjacent to the first light emitting layer 110 and a triplet energy level (T1) of the first light emitting layer 110 in a blue fluorescing unit higher than that of a phosphorescent unit.

Also, as shown in FIG. 2, in addition to the first blocking layer 107, when a triplet energy level ($T_{H1}$) of the first hole transport layer 105 is higher than a triplet energy level ($T_r$) of a general hole transport layer, the blocking performance of the electrons or excitons can be doubled. That is, when triplet excitons or electrons are introduced from the first light emitting layer 110 into the first hole transport layer 105, the higher triplet energy level ($T_{H1}$) of the first hole transport layer 105 blocks introduction of electrons or triplet excitons.

Also, the first hole transport layer 105 has a hole mobility of $5.0 \times 10^{-4}$ $cm^2/s \cdot V$ to $9.9 \times 10^{-3}$ $cm^2/s \cdot V$, thus enabling holes (H) that pass through the first hole injection layer 103 to be smoothly injected into the first light emitting layer 110 due to fast hole movement speed. As such, the high hole mobility of the first hole transport layer 105 improves hole transport function of the first stack and thus increases a hole movement speed even under low current conditions. That is, by using the first hole transport layer 105 having a high hole movement speed, driving voltage can be reduced and, as a result, power consumption can be reduced.

In the drawing, S means a singlet exciton, T means a triplet exciton, and H means a hole. Also, Seb and S1 that are not described represent a singlet energy level of the first blocking layer and a singlet energy level of the light emitting layer, respectively.

Meanwhile, referring to the following drawings, conditions of the hole transport layer (HTL) and the electron transport layer (ETL) adjacent to the light emitting layer (EML) of each stack will be described.

Figure 3:
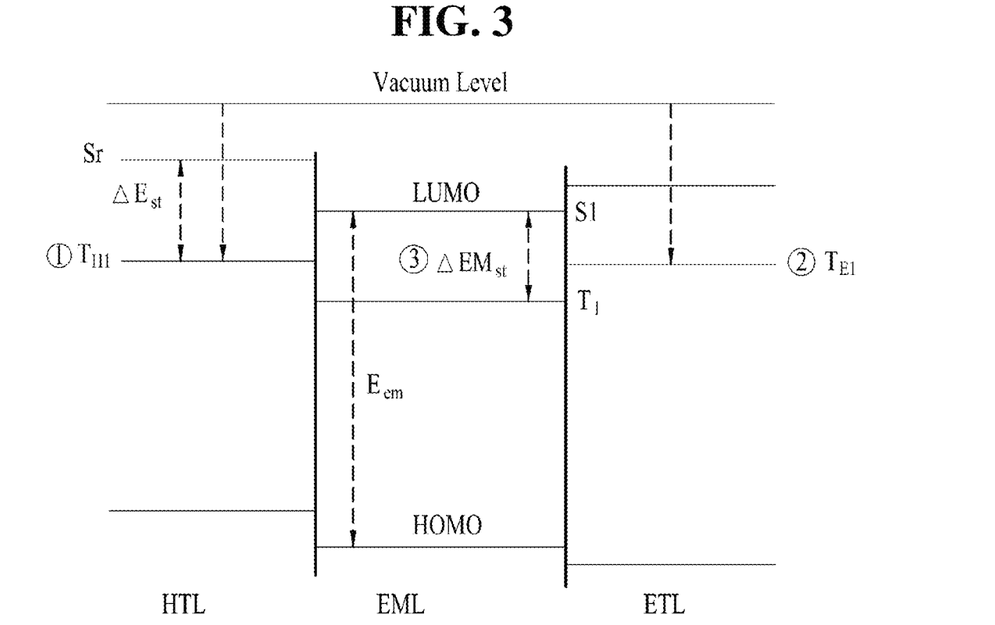
FIG. 3 is a view illustrating energy levels of a hole transport layer, a light emitting layer and an electron transport layer in the white organic light emitting device of the present invention.
Figure 4A:
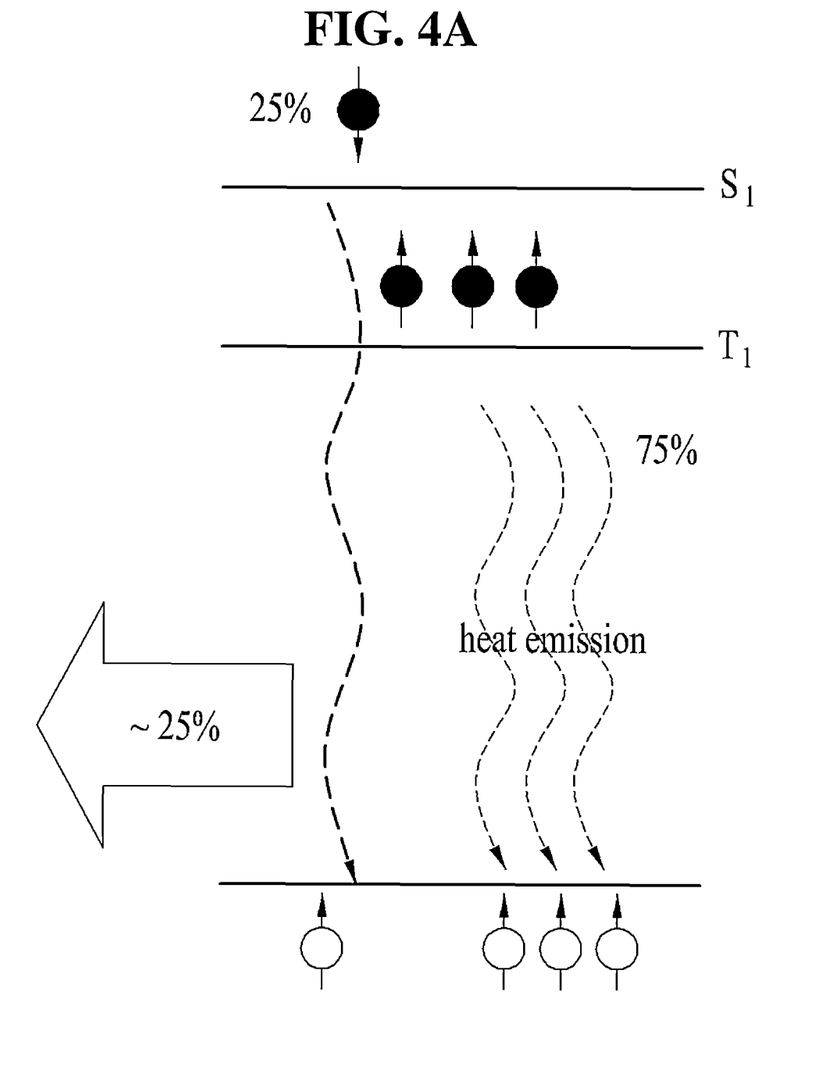
FIGS. 4A and 4B are views illustrating a TTA phenomenon in the white organic light emitting device of the present invention.
Figure 4B:
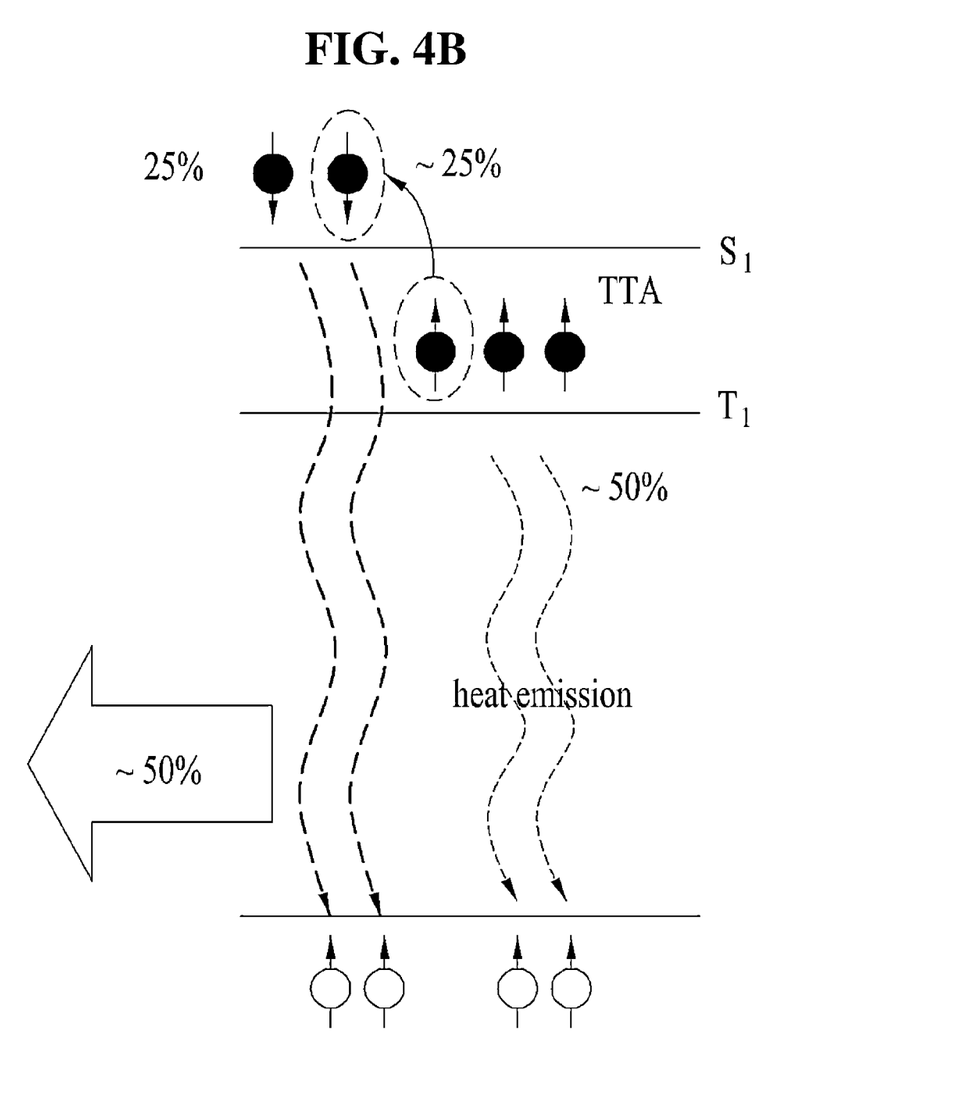

FIG. 3 is a view illustrating energy levels of the hole transport layer, the light emitting layer and the electron transport layer in the white organic light emitting device of the present invention. FIGS. 4A and 4B are views illustrating a TTA phenomenon in the white organic light emitting device of the present invention. In the described drawing, the blocking layer is omitted.

As shown in FIG. 3, the layer that is closest to the light emitting layer (EML), the hole transport layer (HTL) (or blocking layer) has a triplet energy level (Th1) higher than a triplet energy level (T1) of the light emitting layer, and the triplet energy level of the hole transport layer (HTL) is about 2.4 eV or higher.

In the drawing, Sr means a singlet energy level of the hole transport layer.

In the white organic light emitting device of the present invention, as shown in FIG. 4A, the light emitting layer (EML) fluoresces about 25% of singlet excitons and, as shown in FIG. 4B, for contribution to triplet-triplet annihilation (TTA) caused by delay fluorescence of triplet excitons, a material of the hole transport layer (or blocking layer) or the electron transport layer adjacent to the light emitting layer that has a triplet energy level ($T_{H1}$, $T_{E1}$) higher than the host triplet energy level (T1) in the light emitting layer (EML) should be selected.

Also, as shown in FIG. 4B, in order to easily convert triplet excitons into singlet excitons through TTA, the triplet-singlet energy level difference (ΔEMst) of the host in the light emitting layer (EML) should be adjusted to within a predetermined level. That is, the reason for this is that it is important to control a triplet-singlet energy level difference (ΔEMst) in order to easily convert triplet excitons into singlet excitons through TTA.

Also, selection of the hole transport layer (HTL) or the electron transport layer (ETL) adjacent to the light emitting layer is important for contribution of TTA. That is, the hole transport layer is selected, while taking into consideration high triplet energy level and HOMO level with an adjacent hole injection layer.

Also, the electron transport layer is selected while taking into consideration high triplet energy and hole blocking.

Under the aforementioned conditions, fluorescence of triplet excitons (T) is delayed through TTA, triplet excitons may be transformed into singlet excitons and internal quantum efficiency can be increased to a level of about 50%, as shown in FIG. 4B.

Meanwhile, under these conditions, the present invention increases hole mobility of the first hole transport layer of the fluorescing first stack and increases a hole movement speed of the first stack, thus increases a hole diffusion speed to the light emitting layer even under low current conditions and thereby improves electron/hole bonding possibility. Accordingly, efficiency in a low-brightness region in the first stack (blue fluorescent stack) is improved, and the difference between fluorescent color and phosphorescent color in a gray level can be thus reduced. Also, by using a first hole transport layer having a high hole mobility, deterioration in visibility can be prevented even at a low voltage, a driving voltage can be reduced and low power consumption can thus be realized.

Figure 5:
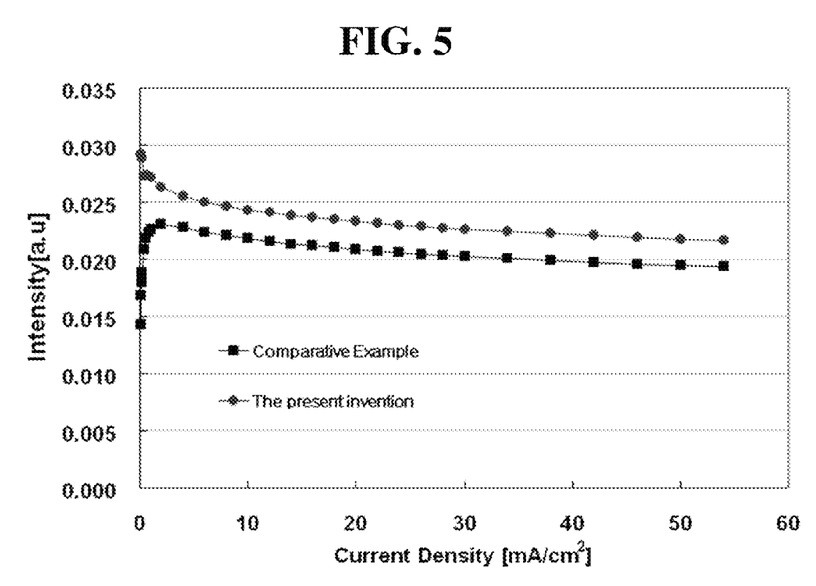
FIG. 5 is a graph showing intensity of light according to current density of the blue fluorescent stack of the white organic light emitting device.

FIG. 5 is a graph showing intensity of light according to current density of the blue fluorescent stack of the white organic light emitting devices of the present invention and Comparative Example.

As shown in FIG. 5, the white organic light emitting device of the present invention exhibits high light intensity of the blue fluorescent stack over all current densities, and in particular, considerably high light intensity at low current densities, as compared with a conventional white organic light emitting device. That is, the blue fluorescent stack of conventional white organic light emitting device exhibits a light intensity of 0.023 or less [a.u at 0 to 2 mA/cm$^2$]. This means that the corresponding blue fluorescent stack has considerably deteriorated light emission property.

Here, tests are performed under conditions that the hole mobility of the hole transport layer in the blue fluorescent stack of the comparative example is 4.0×10$^{-4}$ cm$^2$/s·V and the hole mobility of the hole transport layer in the blue fluorescent stack of the present invention is 9×10$^{-4}$ cm$^2$/s·V.

Figure 6:
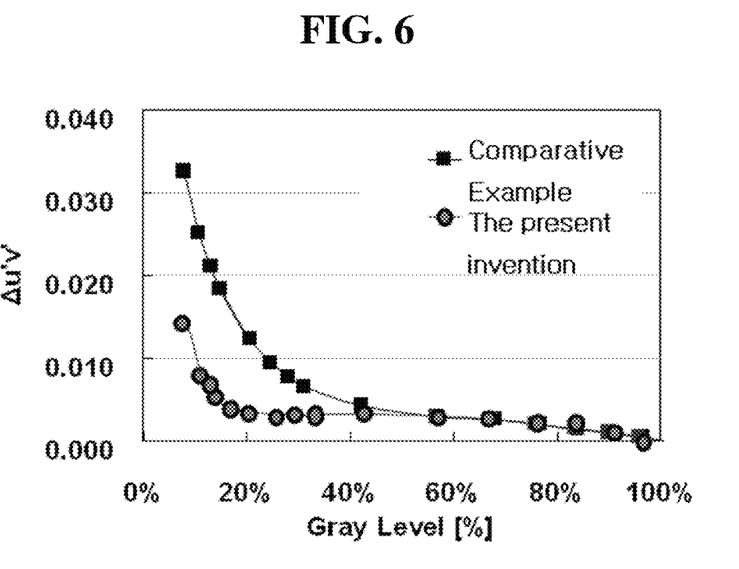
FIG. 6 is a graph showing difference in color according to current variation when white organic light emitting devices of the present invention and Comparative Example display gray levels.

FIG. 6 is a graph showing difference in color according to current variation when white organic light emitting devices of the present invention and Comparative Example display gray levels.

FIG. 6 illustrates gray levels and color difference of white organic light emitting devices having the same phosphorescent stack laminate structure using the blue fluorescent stacks of the comparative example of FIG. 5 and the present invention Here, tests are performed under the condition that the triplet energy level of the hole transport layer of the blue fluorescent stack of comparative example is 2.35 eV, while the triplet energy level of the hole transport layer of the blue fluorescent stack of the present invention is 2.58 eV, that is, triplet energy level of the hole transport layer of the blue fluorescent stack of the present invention is higher than that of the comparative example, as shown in FIG. 2.

In FIG. 6, a low gray level means a low current and a higher gray level means a high current.

In the white organic light emitting devices of the comparative example and the present invention, color difference (Δu'v') of about 40% or more is low, i.e., about 0.002, but the color difference (Δu'v') between Comparative Example and the present invention increases, as the gray level decreases.

In particular, the white organic light emitting device of the present invention has a color difference of about 0.010, thus making intensity of blue fluorescence similar to that of phosphorescence to an extent that a viewer cannot recognize. On the other hand, in Comparative Example, a color difference is higher than 0.010 at a gray level of about 24% or less, which means serious deterioration in image quality.

The aforementioned tests demonstrate that, in the white organic light emitting device according to the present invention, there is no difference in color or the difference is almost unrecognizable even during driving at a low current, and deterioration in image quality can be prevented, when a hole mobility of the hole transport layer and triplet energy level of the hole transport layer are increased, and the triplet energy level of the hole transport layer is higher than the triplet energy level of the light emitting layer to an extent that excitons cannot be introduced from the light emitting layer of the corresponding stack to the hole transport layer in a blue fluorescent stack. Accordingly, the white organic light emitting device of the present invention can realize low power consumption at a low current and improve color sensation.

As apparent from the fore-going, the white organic light emitting device of the present invention has the following effects.

The white organic light emitting device of the present invention increases hole mobility of the hole transport layer of the blue fluorescent stack and thus improves hole movement speed to the light emitting layer even in a low current state.

That is, a display device having a structure including a blue fluorescent stack and a yellow/green or red/green phosphorescent stack using the white organic light emitting device of the present invention improves the efficiency of a blue fluorescent stack that is lower than a phosphorescent stack at a low current or a low brightness, reduces color variation, improves voltage properties and thereby reduces power consumption.

Accordingly, the white organic light emitting device of the present invention reduces color difference between fluorescent color and phosphorescent color at a low current and thus decreases gray color variation, while a conventional white organic light emitting device emits warm white light.

Accordingly, a display device using the white organic light emitting device that is free of variation in color coordinates according to current can be realized without using any additional algorithm.

Furthermore, it is possible to drive organic light emitting devices at a low current, improve voltage properties and realize low power consumption. Accordingly, it is possible to produce white organic light emitting devices with high efficiency and thereby mass-produce large-area white organic light emitting devices (such as TV products) with high color temperature and low power consumption.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A white organic light emitting device comprising:
   an anode and a cathode opposing each other on a substrate;
   a charge generation layer interposed between the anode and the cathode;
   a first stack interposed between the anode and the charge generation layer, the first stack including a first hole transport layer, a first blocking layer directly contacting the first hole transport layer, a first light emitting layer for emitting blue fluorescent light such that the first light emitting layer directly contacts the first blocking layer and comprises a first host and a fluorescent dopant in the first host, and a first electron transport layer directly contacting the first light emitting layer; and
   a second stack interposed between the charge generation layer and the cathode, the second stack including a second hole transport layer, a second blocking layer directly contacting the second hole transport layer, a second light emitting layer directly contacting the second blocking layer and comprising a second host and at least one phosphorescent dopant doped in the second host, and a second electron transport layer directly contacting the second light emitting layer,
   wherein the first light emitting layer and the second light emitting layer are single emitting layers in the first and second stack, respectively,
   wherein a triplet energy level of the first blocking layer is 0.01 eV to 0.4 eV higher than a triplet energy level of the first host to prevent diffusion of excitons from the first light emitting layer,
   wherein a triplet energy level of the first hole transport layer is less than the triplet energy level of the first blocking layer and greater than the triplet energy level of the first host, and
   wherein a hole mobility of the first hole transport layer is $5.0 \times 10^{-4}$ cm$^2$/s·V to $9.9 \times 10^{-3}$ cm$^2$/s·V.

2. The white organic light emitting device according to claim 1, wherein the triplet energy level of the first hole transport layer is 2.4 eV or more.

3. The white organic light emitting device according to claim 1, wherein the phosphorescent dopant of the second light emitting layer comprises a yellow phosphorescent dopant and a green phosphorescent dopant.

4. The white organic light emitting device according to claim 1, wherein the phosphorescent dopant of the second light emitting layer comprises a red phosphorescent dopant and a green phosphorescent dopant.

5. The white organic light emitting device according to claim 1, wherein the phosphorescent dopant of the second light emitting layer comprises a yellowish green phosphorescent dopant.

6. The white organic light emitting device according to claim 1, wherein the hole mobility of the first hole transport layer is $6.0 \times 10^{-4}$ cm$^2$/s·V to $9.9 \times 10^{-3}$ cm$^2$/s·V.

7. The white organic light emitting device according to claim 1, wherein the hole mobility of the first hole transport layer is $6.0 \times 10^{-4}$ cm$^2$/s·V to $5.0 \times 10^{-3}$ cm$^2$/s·V.

8. A white organic light emitting device comprising:
   an anode and a cathode that face each other on a substrate;
   a charge generation layer interposed between the anode and the cathode; and
   a first stack and a second stack interposed between the anode and the charge generation layer, and between the charge generation layer and the cathode, respectively,
   wherein each stack comprises a hole transport layer, a blocking layer directly contacting the hole transport layer, a light emitting layer directly contacting the blocking layer, and an electron transport layer directly contacting the light emitting layer laminated in this order,
   the light emitting layer of the first stack is a single blue fluorescent layer comprising a first host and a fluorescent dopant in the first host, and the light emitting layer of the second stack is a single phosphorescent layer a second host at least one phosphorescent dopant in the second host,
   a triplet energy level of each blocking layer of the first and second stacks is 0.01 eV to 0.4 eV higher than a triplet energy level of the light emitting layer adjacent thereto layer to prevent diffusion of excitons from the respective light emitting layer adjacent thereto, the triplet energy level of each blocking layer of the first and second stacks is higher than a triplet energy level of the hole transport layer adjacent thereto,
   wherein a triplet energy level of the first hole transport layer is less than the triplet energy level of the first blocking layer and greater than the triplet energy level of the first host, and
   a hole mobility of the hole transport layer is $5.0 \times 10^{-4}$ cm$^2$/s·V to $9.9 \times 10^{-3}$ cm$^2$/s·V.

9. The white organic light emitting device according to claim 8, wherein the triplet energy level of the hole transport layer of the first stack is higher than the triplet energy level of the light emitting layer of the first stack and is 2.4 eV or more.

10. The white organic light emitting device according to claim 8, wherein the phosphorescent dopant comprises a yellow phosphorescent dopant and a green phosphorescent dopant.

11. The white organic light emitting device according to claim 8, wherein the phosphorescent dopant comprises a red phosphorescent dopant and a green phosphorescent dopant.

12. The white organic light emitting device according to claim 8, wherein the phosphorescent dopant comprises a yellowish green phosphorescent dopant.

13. The white organic light emitting device according to claim 8, wherein the hole mobility of the first hole transport layer is $6.0 \times 10^{-4}$ cm$^2$/s·V to $9.9 \times 10^{-3}$ cm$^2$/s·V.

14. The white organic light emitting device according to claim 8, wherein the hole mobility of the first hole transport layer is $6.0 \times 10^{-4}$ cm$^2$/s·V to $5.0 \times 10^{-3}$ cm$^2$/s·V.

15. The white organic light emitting device according to claim 14, wherein a triplet energy level of the hole transport layer of the first stack is less than the triplet energy level of the blocking layer of the first stack and greater than the triplet energy level of the light emitting layer of the first stack.

16. The white organic light emitting device according to claim 8, wherein a triplet energy level of the hole transport layer of the first stack is less than the triplet energy level of the blocking layer of the first stack and greater than the triplet energy level of the light emitting layer of the first stack.

* * * * *